United States Patent
Girardey et al.

(10) Patent No.: US 12,550,260 B2
(45) Date of Patent: Feb. 10, 2026

(54) ELECTRIC ASSEMBLY COMPRISING TWO PRINTED CIRCUIT BOARDS

(71) Applicant: Endress+Hauser SE+Co. KG, Maulburg (DE)

(72) Inventors: Romuald Girardey, Blotzheim (FR); Andreas Spitz, Schopfheim (DE); Elke Schmidt, Bad Säckingen (DE); Nils Ponath, Lörrach (DE); Marcel Gfrörer, Marc (DE); Dirk Wiedmann, Lörrach (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 177 days.

(21) Appl. No.: 18/564,656

(22) PCT Filed: May 18, 2022

(86) PCT No.: PCT/EP2022/063469
§ 371 (c)(1),
(2) Date: Nov. 28, 2023

(87) PCT Pub. No.: WO2022/248314
PCT Pub. Date: Dec. 1, 2022

(65) Prior Publication Data
US 2024/0381534 A1    Nov. 14, 2024

(30) Foreign Application Priority Data

May 28, 2021   (DE) .................... 10 2021 113 917.1

(51) Int. Cl.
*H05K 1/14*       (2006.01)
*H05K 3/341*      (2026.01)

(52) U.S. Cl.
CPC ........... *H05K 1/145* (2013.01); *H05K 3/3436* (2013.01); *H05K 2201/10151* (2013.01);
(Continued)

(58) Field of Classification Search
CPC ................. H05K 1/145; H05K 3/3436; H05K 2201/10151
(Continued)

(56) References Cited

U.S. PATENT DOCUMENTS

| | | |
|---|---|---|
| 6,665,194 B1 | 12/2003 | Patel et al. |
| 2004/0227258 A1 | 11/2004 | Nakatani |

(Continued)

FOREIGN PATENT DOCUMENTS

DE    202012006289 U1    10/2012

*Primary Examiner* — Andargie M Aychillhum
(74) *Attorney, Agent, or Firm* — Mark A. Logan; Endress+Hauser (USA) Holding, Inc.

(57) ABSTRACT

An electric assembly comprises at least a first circuit board, a second circuit board, and, packaged in a housing, at least one integrated circuit. The first circuit board and the second circuit board have, respectively, a plurality of first contact areas and a plurality of second contact areas. The housing includes in a first area and in a second area, respectively, a plurality of third contact areas and a plurality of fourth contact areas. The third contact areas and/or the fourth contact areas are electrically connected with the integrated circuit. The first circuit board is mechanically and electrically connected with the first area of the housing via the first contact areas and the third contact areas, and the second circuit board is mechanically and electrically connected with the second area of the housing via the second contact areas and the fourth contact areas.

8 Claims, 1 Drawing Sheet

(52) U.S. Cl.
CPC ............. *H05K 2201/10636* (2013.01); *H05K 2201/10719* (2013.01); *H05K 2201/10734* (2013.01)

(58) Field of Classification Search
USPC ........................................... 361/748
See application file for complete search history.

(56) References Cited

U.S. PATENT DOCUMENTS

| 2015/0366063 | A1* | 12/2015 | Takagi | ............. | H01L 23/49811 |
| | | | | | 29/831 |
| 2019/0150311 | A1* | 5/2019 | Mason | ................. | H05K 3/3436 |
| | | | | | 439/55 |

* cited by examiner

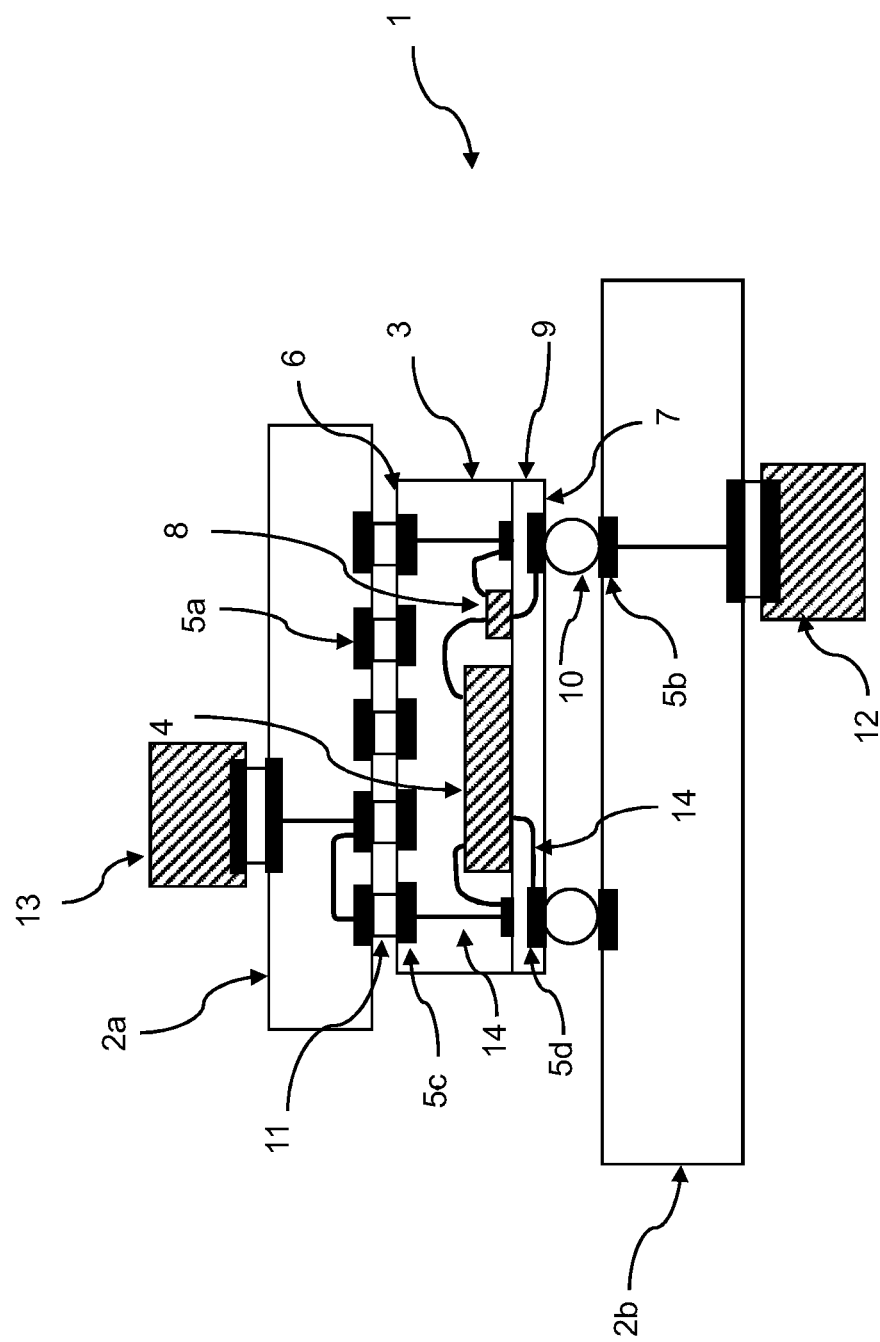

ELECTRIC ASSEMBLY COMPRISING TWO PRINTED CIRCUIT BOARDS

CROSS-REFERENCE TO RELATED APPLICATIONS

The present application is related to and claims the priority benefit of DPMA Patent Application No. 10 2021 113 917.1, filed on May 28, 2021, and International Patent Application No. PCT/EP2022/063469, filed May 18, 2022, the entire contents of which are incorporated herein by reference.

TECHNICAL FIELD

The invention relates to an electric assembly, comprising at least a first circuit board and a second circuit board.

BACKGROUND

Field devices in process and automation technology serve for monitoring and/or determining at least one, for example, chemical and/or physical, process variable of a medium. In the context of the invention, in principle, referred to as field devices are all measuring devices, which are applied near to a process and which deliver, or process, process relevant information. A large number of such field devices are manufactured and sold by the companies of the Endress+Hauser group.

The process variable to be determined by a field device can be the fill level, the flow, the pressure, the temperature, the pH value, a redox potential, or the conductivity of a medium. The different possible measuring principles underpinning determining the process variable are known in the state of the art and are thus not explained here in greater detail. Field devices for measuring fill level are, especially, microwave, fill level measuring devices, ultrasonic, fill level measuring devices, time domain reflectometric, fill level measuring devices (TDR), radiometric, fill level measuring devices, capacitive, fill level measuring devices, conductive, fill level measuring devices and vibronic, fill level measuring devices. Field devices for measuring flow, in contrast, work, for example, according to the Coriolis-, ultrasonic-, vortex-, thermal and/or magnetically inductive measuring principle. In the case of pressure measuring devices, there are absolute-, relative-and pressure difference devices. Besides the above mentioned measuring devices and actuators, understood as field devices are also remote I/Os, radio adapters, and, generally, devices, which are arranged at the field level.

A field device typically includes a sensor, coming, at least partially, and/or at least at times, in contact with the process, and an electronics unit, which serves, for example, for signal registration, signal evaluation and/or signal feeding. The electronics unit of the field device is typically arranged in a housing and has, supplementally, at least one connecting element for connecting the electronics unit to the sensor and/or to an external unit and for transmitting data and/or energy. The connecting element can be any connection, even a wireless connection can be used. The electronics unit and the sensor of the field device can be embodied as separate units with separate housings or as one unit in a shared housing.

The electronics unit frequently includes a plurality of circuit boards, which are mechanically and electrically connected together. The use of a plurality of circuit boards has essentially two causes, lack of space and a desire for modular systems. Thus, for example, in the sensor in the region of the connection to the electronics unit little space can be present, such that a single circuit board cannot accommodate all required components. As regards the second cause, the production of separate modules of the sensor and/or the electronics leads to the fact that the different modules can have different circuit boards, which then need to be connected with the circuit boards of the other modules.

For connection of the circuit boards, usually plugs are applied, in combination with sockets, or flexible ribbon cable. These components serve only for mechanical and electrical connection of the circuit boards.

SUMMARY

It is, consequently, an object of the invention to provide an electric assembly having an alternative connection of at least two circuit boards.

The object of the invention is achieved according to the invention by an electric assembly, comprising at least a first circuit board, a second circuit board and, packaged in a housing, at least one integrated circuit,
   wherein the first circuit board and the second circuit board have, respectively, a plurality of first contact areas and a plurality of second contact areas,
   wherein the housing includes in a first area and in a second area, respectively, a plurality of third contact areas and a plurality of fourth contact areas, wherein the third contact areas and/or the fourth contact areas are electrically connected, at least partially, with the at least one integrated circuit,
   wherein the first circuit board is mechanically and electrically connected with the first area of the housing by means of the first contact areas and the third contact areas, and
   wherein the second circuit board is mechanically and electrically connected with the second area of the housing by means of the second contact areas and the fourth contact areas.

Instead of a conventional plug-in connection, in such case, a housing of at least one integrated circuit is applied for mechanical and electrical connection of two circuit boards. The at least one integrated circuit in such case can be a component usually on the first or second circuit board, i.e. for connection a component is applied, which would have been present in any event. In the case of a plug-in connection, in contrast, a separate plug or socket needs to be placed on the first and second circuit boards to serve exclusively for the connection and otherwise has no other function. Applied on the first area and the, especially opposite the first area, second area of the housing are a plurality of third and fourth contact areas, which are subsequently soldered with the corresponding contact areas of the two circuit boards, for example, using solder paste, such that a sandwich structure results with the housing in the middle. The housing is, in such case, a plastic housing, which can be produced by means of an injection molding method. The first, second, third and fourth contact areas are formed as metallized regions on the surfaces of the components, such that they can, in given cases, be soldered by means of the application of solder paste and are electrically conductive.

Preferably, the first contact areas and the third contact areas and/or the second contact areas and the fourth contact areas are embodied as QFN-, LGA-, DFN- or BGA arrangements. The plurality of first contact areas and the plurality of third contact areas as well as the plurality of second contact areas and the plurality of fourth contact areas are preferably embodied correspondingly relative to one another. QFN (Quad Flat No Leads), LGA (Land Grid Array) and DFN (Dual Flat No-Lead) describe arrangements, in the case of which the contact areas are integrated planarly in the area of the given circuit board or the housing. The BGA (Ball Grid Array) arrangement, in contrast, involves solder beads, or solder balls, formed on the contact areas. For soldering the contact areas, solder paste needs to be applied on at least one part of the contact areas.

Advantageously, the first circuit board and/or the second circuit board are/is embodied as a rigid circuit board. Alternatively, the first circuit board and/or the second circuit board are/is embodied flexibly.

In a further development, the at least one integrated circuit is embodied to receive an electrical, primary signal from the first circuit board. The at least one integrated circuit is, thus, a necessary component for the first circuit board and fulfills besides the connecting function also a receiving function. The electrical, primary signal comes, for example, from a sensor.

In an additional embodiment, the at least one integrated circuit is embodied to forward the electrical, primary signal to the second circuit board. In such case, the electrical, primary signal is forwarded unprocessed to the second circuit board. For example, the at least one integrated circuit can output an electrical, primary signal, when the electrical, primary signal reaches a limit value, and forward such directly to the second circuit board, which, for example, generates an alarm from the electrical, primary signal.

Another embodiment provides that the at least one integrated circuit is embodied to convert the electrical, primary signal into an electrical, secondary signal and to forward the electrical, secondary signal to the second circuit board. In such case, the electrical, primary signal is, firstly, processed by the at least one integrated circuit and then transmitted to the second circuit board as electrical, secondary signal. Besides the mechanical and electrical connection, thus, by means of the at least one integrated circuit and the housing, an intelligent connection is created, via which electrical signals are processed and forwarded.

In an additional embodiment, at least one component arranged on the second circuit board is embodied to process the electrical, secondary signal. The circuit board receives the electrical, secondary signal forwarded from the at least one integrated circuit and processes it further, in that it, for example, linearizes the electrical, secondary signal or conditions it according to a communication protocol of automation technology, such as, for example, a fieldbus protocol.

In an additional embodiment, the housing and the at least one integrated circuit packaged in the housing are manufacturable by means of a System-in-Package method. System-in-Package methods are demanding methods of production, which occur in a clean room, and, compared with conventional circuit boards, work with thinner substrates as support material for the components to be arranged thereon. The housing is placed on the at least one integrated circuit by means of an injection molding method. The at least one integrated circuit arranged in the housing represents therewith a complex, integrated component.

In an additional embodiment, at least two integrated circuits are packaged in the housing. Also this embodiment is manufacturable by means of a System-in-Package method.

In an alternative embodiment, packaged in the housing are at least one integrated circuit and at least one other electrical component. Also this embodiment is manufacturable by means of a System-in-Package method. Other components integrated in the housing include, for example, high frequency antennas, MEMS based microsystems and quartz oscillators, resistances, capacitors, inductances, etc. The at least one other electrical component can be a passive or active component.

BRIEF DESCRIPTION OF THE DRAWING

The present disclosure will now be explained in greater detail based on the appended drawing, the sole figure of which shows as follows:

FIG. 1 shows a schematic view of the electric assembly of the present disclosure.

DETAILED DESCRIPTION

The electric assembly 1 includes at least a first circuit board 2a, a second circuit board 2b and, packaged in a housing 3, at least one integrated circuit 4. The electric assembly can be applied in all types of field devices, which were mentioned above in nonexclusive manner.

The first circuit board 2a and the second circuit board 2b have, respectively, a plurality of first contact areas 5a and a plurality of second contact areas 5b. Housing 3, in turn, has, on a first area 6, a plurality of third contact areas 5c and, on a second area 7 opposite the first area 6, a plurality of fourth contact areas 5d. The first area 6 and the second area 7 can, alternatively, be arranged neighboring relative to one another, or perpendicularly relative to one another. The at least one integrated circuit 4 is electrically connected, at least partially, with one of the plurality of third contact areas 5c and/or one of the plurality of fourth contact areas 5d, for example, with a connector 14.

The electrical and mechanical connection of the individual components occurs, for example, by means of soldering. The connection of the first circuit board 2a with the first area 6 of the housing 3 occurs by means of solder joints between the plurality of first contact areas 5a and the plurality of third contact areas 5c. Likewise the connecting of the second circuit board 2b with the second area 7 of the housing 3 occurs by means of solder joints between the plurality of second contact areas 5b and the plurality of fourth contact areas 5d. Optionally, the first circuit board 2a and/or the second circuit board 2b is a rigid circuit board.

The first contact areas and the third contact areas and/or the second contact areas and the fourth contact areas are, for example, QFN-, LGA-, DFN- or BGA arrangements. Shown in FIG. 1, for example, are a plurality of fourth contact areas 5d embodied as a BGA arrangement, such as can be seen from the solder beads 10. The pluralities of first, second and third contact areas 5a,b,c are embodied, by way of example, as planar contact areas in the form of a QFN-, LGA-, or DFN arrangement. For soldering the first contact areas 5a with the third contact areas 5c in this case, solder paste 11 is applied.

By way of example, arranged on the first circuit board 2a is a sensor 13 and arranged on the second circuit board 2b is a component 12. Sensor 13 is embodied, for example, to output an electrical, primary signal to the at least one integrated circuit 4, which receives the electrical, primary signal. Furthermore, the at least one integrated circuit 4 can be embodied to forward the electrical, primary signal to the second circuit board 2b or, firstly, to convert it into an electrical, secondary signal, before forwarding it to the second circuit board 2b. In this regard, the at least one integrated circuit 4 is electrically connected especially with the third contact areas 5c and the fourth contact areas 5d. An option for connection makes use of the connection 14.

Optionally, the at least one component 12 can be provided on the second circuit board 2b for processing the electrical, secondary signal further.

FIG. 1 shows, by way of example, besides the at least one integrated circuit 4, at least one other electrical component 8 packaged in the housing 3. Alternatively, at least two integrated circuits 4 are arranged in the housing 3. Optionally, the at least one integrated circuit 4 or, in given cases, the at least two integrated circuits 4 or, in given cases, the at least one integrated circuit 4 and the at least one other electrical component 8 is/are manufacturable by means of a System-in-Package method. In such case, the at least one integrated circuit 4 is typically arranged on a substrate 9, which is thinner and more difficult to handle than usual circuit boards.

The invention claimed is:

1. An electric assembly, comprising:
 a first circuit board;
 a second circuit board; and,
 packaged in a housing, at least one integrated circuit that is embodied to receive an electrical, primary signal from the first circuit board,
 wherein the at least one integrated circuit is further embodied to convert the electrical, primary signal into an electrical, secondary signal and to forward the electrical, secondary signal to the second circuit board
 wherein the first circuit board has a plurality of first contact areas and the second circuit board has a plurality of second contact areas,
 wherein the housing includes in a first area a plurality of third contact areas and in a second area a plurality of fourth contact areas, wherein the third contact areas and/or the fourth contact areas are electrically connected, at least partially, with the at least one integrated circuit,
 wherein the first circuit board is mechanically and electrically connected with the first area of the housing via the first contact areas and the third contact areas, and
 wherein the second circuit board is mechanically and electrically connected with the second area of the housing via the second contact areas and the fourth contact areas.

2. The electric assembly as claimed in claim 1,
 wherein the first contact areas and the third contact areas and/or the second contact areas and the fourth contact areas are embodied as Quad Flag No-leads (QFN), Land Grid Array (LGA), Dual Flat No-leads (DFN), or Ball Grid Array (BGA) arrangements.

3. The electric assembly as claimed in claim 1,
 wherein the first circuit board and/or the second circuit board are/is a rigid circuit board.

4. The electric assembly as claimed in claim 1,
 wherein the at least one integrated circuit is further embodied to forward the electrical, primary signal to the second circuit board.

5. The electric assembly as claimed in claim 1,
 wherein at least one component arranged on the second circuit board is embodied to process the electrical, secondary signal.

6. The electric assembly as claimed in claim 1,
 wherein the housing and the at least one integrated circuit packaged in the housing are manufacturable by means of a System-in-Package method.

7. The electric assembly as claimed in claim 1,
 wherein at least two integrated circuits are packaged in the housing.

8. The electric assembly as claimed in claim 1,
 wherein the at least one integrated circuit and at least one other electrical component are packaged in the housing.

* * * * *